(12) United States Patent
Wong (10) Patent No.: US 10,763,806 B2
(45) Date of Patent: Sep. 1, 2020

(54) ENVELOPE TRACKING METHOD, SYSTEM, AND DEVICE EMPLOYING THE METHOD

(71) Applicant: Chiun Mai Communication Systems, Inc., New Taipei (TW)

(72) Inventor: Kwo-Jyr Wong, New Taipei (TW)

(73) Assignee: Chiun Mai Communcation Systems, Inc., New Taipei (TW)

( * ) Notice: Subject to any disclaimer, the term of this patent is extended or adjusted under 35 U.S.C. 154(b) by 0 days.

(21) Appl. No.: 16/212,707

(22) Filed: Dec. 7, 2018

(65) Prior Publication Data

US 2019/0238108 A1  Aug. 1, 2019

(30) Foreign Application Priority Data

Jan. 29, 2018  (CN) .......................... 2018 1 0085789

(51) Int. Cl.
| | | |
|---|---|---|
| *H04K 1/02* | (2006.01) | |
| *H03F 3/24* | (2006.01) | |
| *H03F 1/32* | (2006.01) | |
| *H03F 1/02* | (2006.01) | |
| *H03F 3/68* | (2006.01) | |

(52) U.S. Cl.
CPC ............. *H03F 3/24* (2013.01); *H03F 1/0211* (2013.01); *H03F 1/3247* (2013.01); *H03F 3/68* (2013.01); *H03F 2200/102* (2013.01); *H03F 2200/294* (2013.01); *H03F 2200/451* (2013.01)

(58) Field of Classification Search
CPC ........ H03F 3/24; H03F 1/0211; H03F 1/3247; H03F 3/68; H03F 2200/102; H03F 2200/294; H03F 2200/451
USPC ................................ 375/297, 295, 316, 219
See application file for complete search history.

(56) References Cited

U.S. PATENT DOCUMENTS

| | | |
|---|---|---|
| 9,843,260 B1 | 12/2017 | Paek et al. |
| 2017/0141736 A1 | 5/2017 | Pratt et al. |
| 2017/0294951 A1* | 10/2017 | Weissman ................. H03F 3/19 |
| 2017/0331433 A1* | 11/2017 | Khlat ......................... H03F 3/68 |

FOREIGN PATENT DOCUMENTS

| | | |
|---|---|---|
| CN | 102340283 A | 2/2012 |
| CN | 106712723 A | 5/2017 |

\* cited by examiner

*Primary Examiner* — Zewdu A Kassa
(74) *Attorney, Agent, or Firm* — ScienBiziP, P.C.

(57) ABSTRACT

An envelope tracking device includes a fine slot peak tracking (FSPT) circuit, at least one power amplifier, and an envelope modulator. The FSPT circuit is connected to the power amplifier through the envelope modulator. The FSPT circuit generates envelope signals based on input signals, adds an offset to the envelope signals, and expands and smoothes the added envelope signals. The envelope modulator generates envelope voltage signals according to the smoothed envelope signals, and outputs the signals to drain of the power amplifier. The envelope voltage signals are time-aligned with the amplified signals which are transmitted to gate of the power amplifier.

19 Claims, 11 Drawing Sheets

ENVELOPE TRACKING METHOD, SYSTEM, AND DEVICE EMPLOYING THE METHOD

FIELD

The subject matter herein generally relates to communication technology, particularly to an envelope tracking method, system and a device employing the method.

BACKGROUND

Problems existing in traditional envelope technology include for example, bandwidth of envelope signal being proportional to bandwidth of input signal, and the bandwidth of the envelope signal being more than twice the bandwidth of the input signal. When the bandwidth of the input signal is broad, the bandwidth of the envelope signal needs to be wider, and this causes loss of efficiency for a wireless communication system. If the transmission path of the input signal and transmission path of the envelope signal are different, such difference can cause time misalignments, which could lead to other problems (e.g., signal distortion).

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. It should be noted that references to "an" or "one" embodiment in this disclosure are not necessarily to the same embodiment, and such references mean "at least one."

The term "module", as used herein, refers to logic embodied in hardware or firmware, or to a collection of software instructions, written in a programming language, such as, Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY™, flash memory, and hard disk drives. The term "comprises" means "including, but not necessarily limited to"; it specifically indicates open-ended inclusion or membership in a so-described combination, group, series, and the like.

The techniques described in present disclosure can be used in various communication systems. For example, Global System for Mobile Communication (GSM), Wide Band Code Division Multiple Access (WCDMA), 2G Communication systems such as Global System for Mobile Communication (GSM), 3G communication systems such as Wide Band Code Division Multiple Access (WCDMA) and Time Division-Synchronization Code Division Multiple Access (td-scdma). The techniques described in present disclosure can be used in various communication systems. For example, Global System for Mobile Communication (GSM), Wide Band Code Division Multiple Access (WCDMA), 2G Communication systems such as Global System for Mobile Communication (GSM), 3G communication systems such as Wide Band Code Division Multiple Access (WCDMA) and Time Division-Synchronization Code Division Multiple Access (td-scdma). They can also be used in Long-term Evolution (LTE) communication system and its subsequent evolution system and other next-generation communication systems.

Power amplifier provided in the embodiments of the present invention can be integrated into a network element, such as a base station, which needs to amplify power of wireless signal. The power amplifier can work in RF part of the base station, for example, it can be in the Remote Radio Unit (RRU) of the base station. The base station can be a Base Transceiver Station (BTS) of the GSM system or CDMA system, or a Node B of the WCDMA system, or an e-Node B of the LTE system, or in similar devices in the subsequent evolution of LTE communication system.

Figure 1:
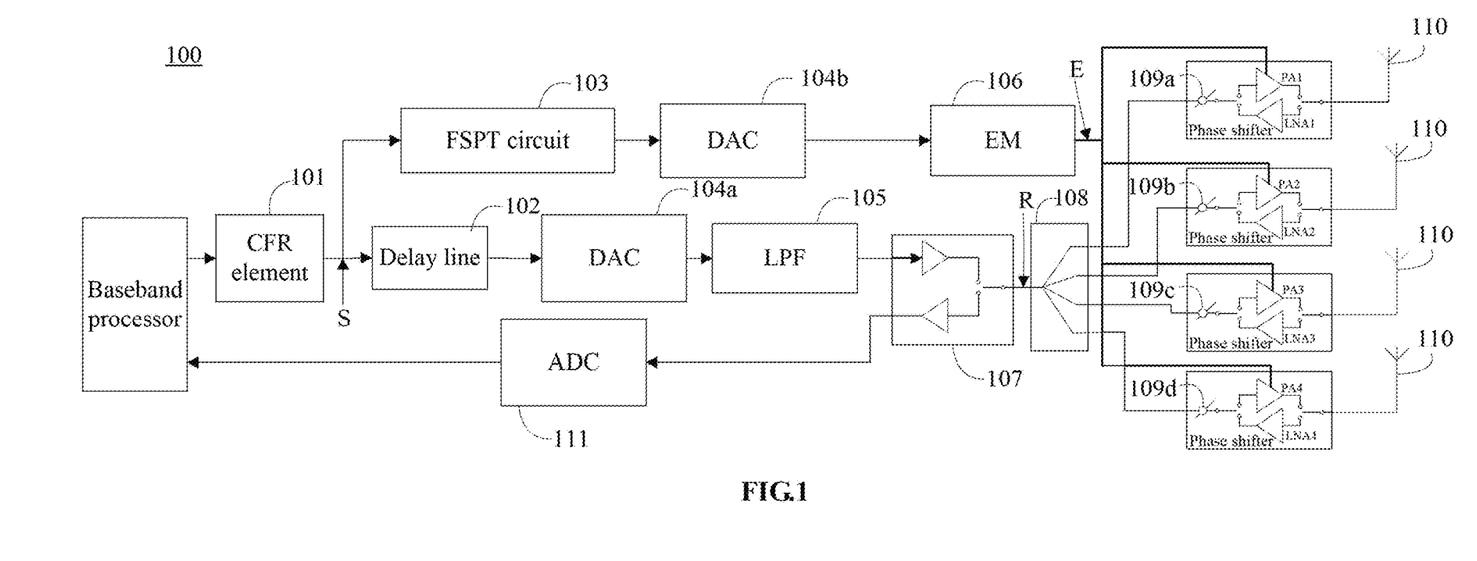
FIG. 1 is a block diagram of one embodiment of an envelope tracking device.

FIG. 1 is a block diagram of one embodiment of an envelope tracking device. Depending on the embodiment, the envelope tracking device 100 can include, but is not limited to, a fine slot peak tracking (FSPT) circuit 103, a crest factor reduction (CFR) element 101, a delay line 102, digital-to-analog converters (DACs) 104a and 104b, a low-pass filter (LPF) 105, an envelope modulator (EM) 106, a TX up converter 107a, a RX down converter 107b, a power divider (PD) 108, phase shifters 109a, 109b, 109c, and 109d, power amplifiers PA1, PA2, PA3, and PA4, low noise amplifiers LNA1, LNA2, LNA3 and LNA4, an antenna 110, and an analog-to-digital converter (ADC) 111. One or more of the above components can be in an integrated circuit or module. For example, the integrated circuit can be a general purpose processor, a field programmable gate array (FPGA), a digital signal processor, other programmable logic device, or an application-specific integrated circuit (ASIC). FIG. 1 illustrates only one example of the envelope tracking device 100, other examples can include more or fewer components than illustrated, or have a different configuration of the various components in other embodiments.

In at least one embodiment, a front end module (FEM) can be constituted by the phase shifters, the power amplifiers and the low noise amplifiers. The FEM is located close to the antenna 110. The FEM can include a transmitting path and a receiving path for transmitting and/or receiving signals. The power amplifiers PA1, PA2, PA3 and PA4 can be located on the transmitting path, and the low noise amplifiers LNA1, LNA2, LNA3 and LNA4 can be located on the receiving path.

In at least one embodiment, the CFR element 101 can maintain peak to average power ratio (PAPR) of input signals within a certain range. The input signals can be transmitted after being processed by the power amplifier. In general, the power amplifier can include nonlinear transistors. When the input signals are weak, the nonlinear transistors of the power amplifier can maintain the input signals as linear. When the input signals are strong, nonlinear distortion of the power amplifier becomes more obvious, and the input signals can become nonlinear. Thus, the CFR element 101 can limit the PAPR of the input signals to a small value, which improves efficiency of the power amplifier. Accordingly, power consumption is significantly reduced and heat dissipation will cost less.

The main principle of the CFR element 101 is to choose a maximum level of the input power of the power amplifier, and when the amplitude of the input signal exceeds the maximum level, the CFR element 101 can cut out the amplitude of the input signal above the maximum, to keep the PAPR of the input signals within the certain range. However, when the CFR element 101 decreases the PAPR of the input signals, the error vector magnitude (EVM) and adjacent channel power ratio (ACPR) of the input signals are increased. Therefore, the CFR element 101 can use a peak clipping waveform with a signal bandwidth equal to the signal bandwidth of the input signals to cut the peak of the input signals, simultaneously retaining the performance of the PAPR, the EVM, and the ACPR.

In at least one embodiment, input signals from a baseband processor can be transmitted to the CFR element 101, and the CFR element 101 can output the input signals to the delay line 102 and the FSPT circuit 103. The delay line 102 can output the input signals to the DAC 104a, and the DAC 104a can convert the input signals to analog signals. The DAC 104a can output the analog signals to one or more low-pass filters (e.g., the LPF 105), and the one or more low-pass filters can output the input signals to the TX up converter 107a. The delay line 102 can compensate for time misalignment between the input signals and DC power supply, where the time misalignment is caused by the envelope modulation and amplification path.

The FSPT circuit 103 can generate envelope signals by tracking the peak value of the input signals which are outputted by the CFR element 101. The FSPT circuit 103 can output the signals to the DAC 104b, and the DAC 104b can convert the signals to analog signals. The DAC 104b can output the analog signals to the envelope modulator 106. The construction and principle of the FSPT circuit 103 are described below.

In at least one embodiment, the envelope modulator 106 is connected to the drains of the power amplifiers PA1, PA2, PA3, and PA4. The envelope modulator 106 can transfer the envelope signals generated by the FSPT circuit 103 to an envelope voltage, and output the envelope voltage to the power amplifiers PA1, PA2, PA3, and PA4. The envelope signals can track operating voltage of the power amplifiers PA1, PA2, PA3, and PA4.

In at least one embodiment, the power divider 108 can divide the power of the input signals into equal or unequal parts. The power divider 108 can be a power combiner used in reverse.

In at least one embodiment, the power amplifiers PA1, PA2, PA3, and PA4 are connected to the envelope modulator 106. The power amplifiers PA1, PA2, PA3, and PA4 can set the envelope voltage received from the envelope modulator 106 as the operating voltage to amplify the signals input from the gates of the power amplifiers.

In at least one embodiment, the low noise amplifiers LNA1, LNA2, LNA3, and LNA4 can be provided on the receiving path. The signal-to-noise ratio of the input signals is low when the input signals are transmitted on the receiving path; however, after the input signals are output from the amplifier, the input signals and the noise are amplified at the same time, which is disadvantaged for further processing. Thus, the low noise amplifier is utilized in the receiving path to suppress the whole system noise.

In at least one embodiment, the CFR element 101 can output the input signals to the delay line 102, and the delay line 102 can transmit the input signals to the DAC 104a. The DAC 104a can convert the input signals to analog signals and output the analog signals to the LPF 105 for eliminating spurious signals from the analog signals. After eliminating the spurious signals, the LPF 105 can output the analog signals to the TX up converter 107a. The TX up converter 107a can output the analog signals to the power divider 108. The power divider 108 can divide the analog signals into four sub-signals, and output each of the sub-signals to the phase shifters 109a, 109b, 109c, and 109d, respectively. The sub-signals from the phase shifters 109a, 109b, 109c, and 109d are output to the gates of the power amplifiers PA1, PA2, PA3, and PA4.

In at least one embodiment, the input signals from the CFR element 101 further can be output to the FSPT circuit 103. The FSPT circuit 103 can convert the input signals to envelope signals. The envelope signals from the FSPT circuit 103 are output to the DAC 104b. The DAC 104b can convert the envelope signals to analog signals, and output the analog signals to the envelope modulator 106 for envelope tracking. An output port of the envelope modulator 106 is connected to the gates of the power amplifiers PA1, PA2, PA3, and PA4.

In at least one embodiment, the FSPT circuit 103 of the envelope tracking device 100 can be applied to Time Division Duplex (TDD) communication system and Frequency Division Duplex (FDD) communication system. The envelope tracking device 100 according to the present disclose can increase the bandwidth of the input signals to GHz level by adjusting width of fine slot signals, filter structure, width of signal peaks and bandwidth of low pass filters. In time domain, the FSPT circuit 103 can convert the input signals (e.g., baseband signals) to fine slot signals with no loss. In addition, the loss of the signal quality, caused by the difference between the path from the output of the CFR element 101 to the drain of the power amplifier and the path from the output of the CFR element 101 to the gate of the power amplifier, can be compensated by adjusting the width of peak of the fine slot signal. For example, the difference can be length difference between the paths or delay time difference between the phase shifters, which may cause signals to be processed with inconsistent arrival time.

Figure 2:
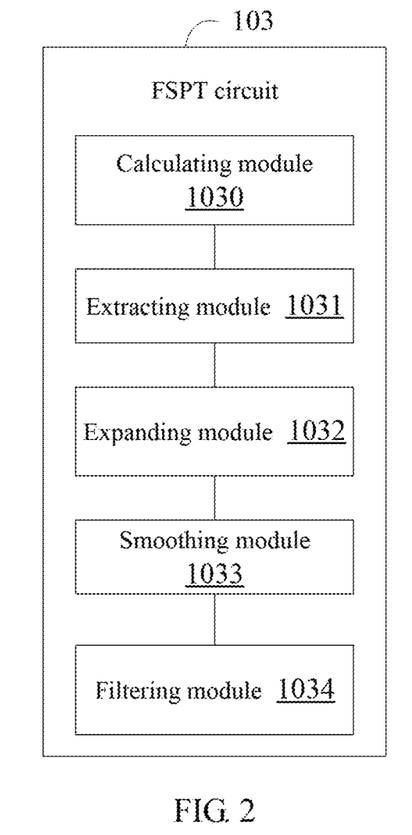
FIG. 2 is a block diagram of one embodiment of modules of a fine slot peak tracking (FSPT) circuit of the envelope tracking device of FIG. 1.
Figure 3:
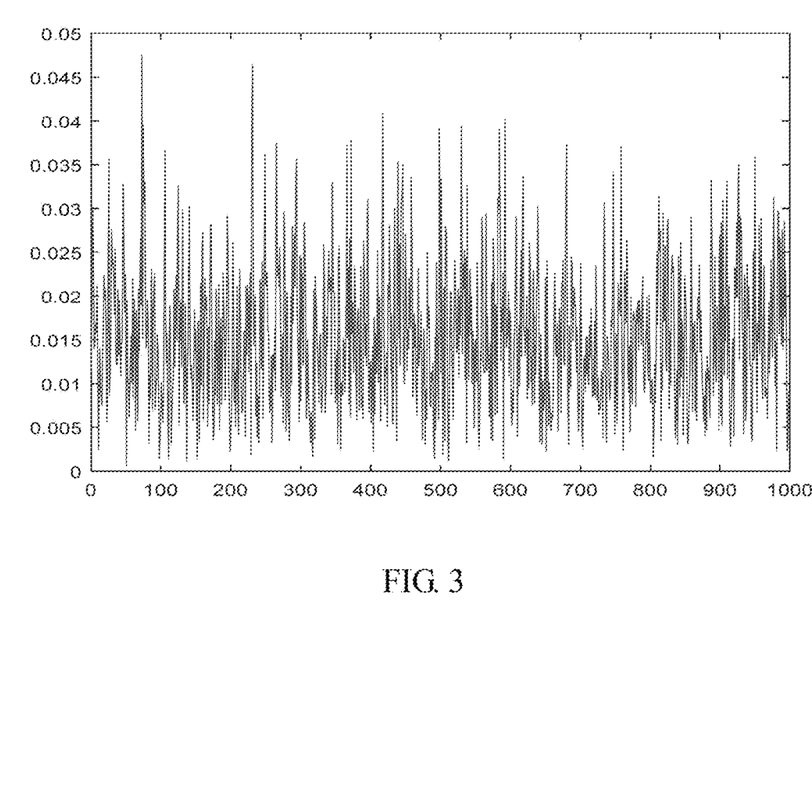
FIG. 3 shows a sample of RF signals.

FIG. 2 is a block diagram of one embodiment of modules of the FSPT circuit of the envelope tracking device. In at least one embodiment, the FSPT circuit 103 can include a calculating module 1030, an extracting module 1031, an expanding module 1032, a smoothing module 1033, and a filtering module 1034. In one embodiment, the FSPT circuit 103 can sample the input signals to obtain sample signals. Such sample signals are shown in FIG. 3. For example, the FSPT circuit 103 can sample the input signals with bandwidth of 20 MHz, the sampling frequency is 30.72 MHz, and there are 1000 samples.

In at least one embodiment, the calculating module 1030 can calculate the square of the amplitude of the sample signals, $D_i$=Sum_of_Square(t), Sum_of_Square(t)=$I^2$(t)+$Q^2$(t). I(t) represents the in-phase signal of the input signal, and Q(t) represents the orthogonal signal of the input signal.

In at least one embodiment, the extracting module 1031 can divide the sample signals into equal parts based on a pulse width, and extract the maximum number of equal parts of the calculated sample signals. For example, the extracting module 1031 can divide 1000 sample signals into 500 equal parts, each part of the divided signal being D1, D2 . . . DN, and N=20. The maximum number of equal parts of the calculated sample signals is $D_m$=Max_of[$D_1$, $D_2$ . . . $D_N$]. Thus, the pulse width is equal to a sum of the width of 20 consecutive sample signals of the 1000 sample signals.

Figure 4:
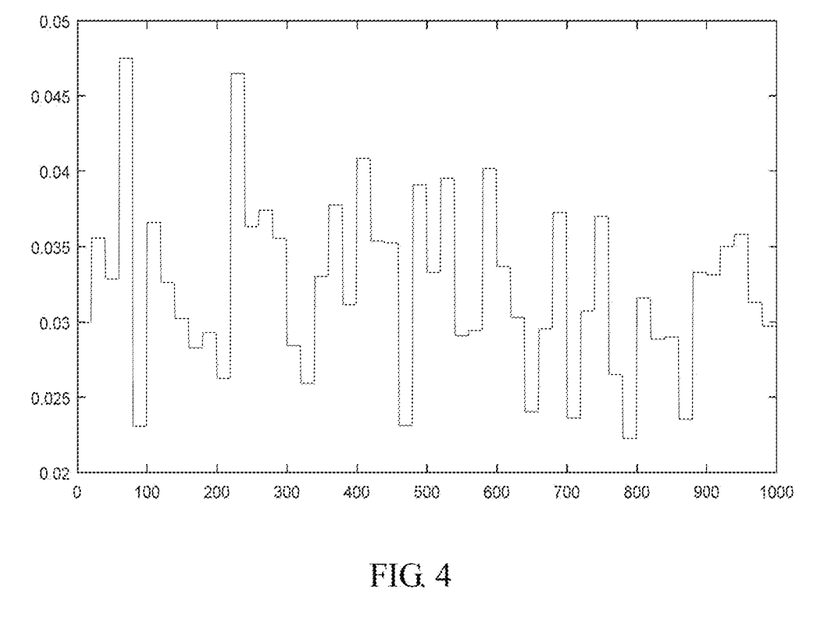
FIG. 4 shows envelope signals generated by the FSPT circuit of the envelope tracking device of FIG. 1.

In at least one embodiment, the extracting module 1031 can generate envelope signals based on a square root of maximum number of equal parts of the calculated sample signals, Sqrt($D_m$)=$\sqrt{\text{Max\_of}[D_1,D_2...D_N]}$. The envelope signals are shown in FIG. 4. The amplitude of each pulse of the envelope signals is equal to the square root of maximum of equal parts of the calculated sample signals, and the width of each pulse of the envelope signals is the same.

In at least one embodiment, the expanding module 1032 can add an offset to the envelope signals, Peak$_j$=Sqrt($D_m$)+offset, and expand the added envelope signals. The added envelope signals can cover the peak amplitude of the input signals. The extension module 1032 are described below.

In at least one embodiment, the smoothing module 1033 can smooth the expanded envelope signals. The smoothing module 1033 can reduce ringing effects of the expanded envelope signals by moving average technology.

In at least one embodiment, the filtering module 1034 can reduce noise of the envelope signals by using a low-pass filter.

Figure 5:
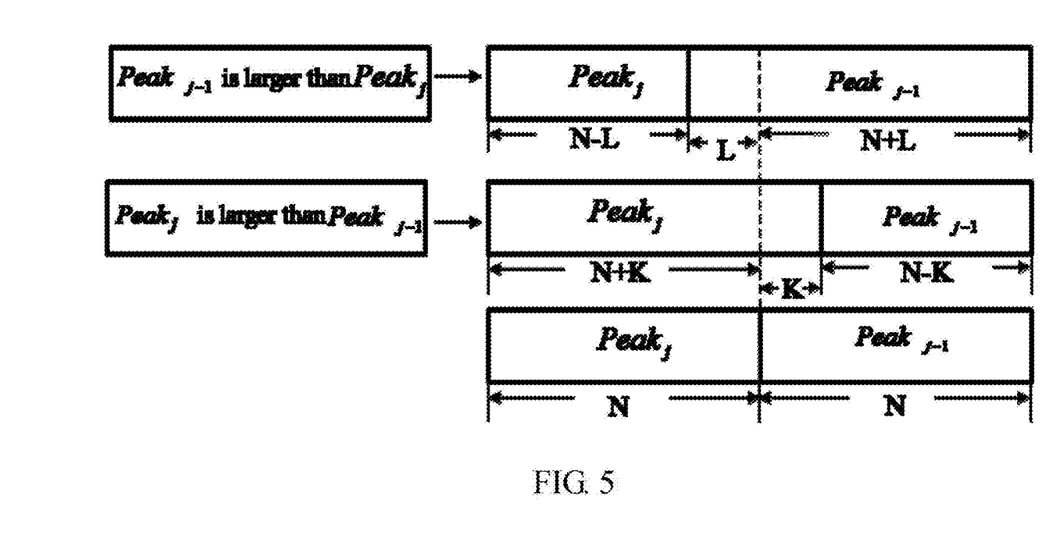
FIG. 5 shows a schematic diagram of the expansion of two envelope signals adjacent to each other.

FIG. 5 is a schematic diagram illustrating expansion of two neighboring envelope signals. In at least one embodiment, the expanding module 1032 can include a first register and a second register storing respectively two neighboring envelope signals. The peak amplitude of first envelope signal is Peak$_j$, and the first envelope signal is stored in the first register. The peak amplitude of second envelope signal is Peak$_{j-1}$, and the second envelope signal is stored in the second register. Each of the two neighboring envelope signals includes N samples, and the pulse widths of the two neighboring envelope signals are the same. The first register can be compared with the second register to determine which peak amplitude of the two neighboring envelope signals is greater. When Peak$_j$ is greater than Peak$_{j-1}$, the expanding module 1032 can expand the first envelope signal with K samples. When Peak$_{j-1}$ is greater than Peak$_j$, the expanding module 1032 can expand the second envelope signal with L samples. The values of K and L are dependent on the system.

In at least one embodiment, the expanding module 1032 can expand the envelope signals to the right or left, or expand simultaneously in both directions. For example, the expanding module 1032 can expand the first envelope signal to the right or left with K samples, or expand the first envelope signals to the right and left with K samples at the same time.

Figure 6A:
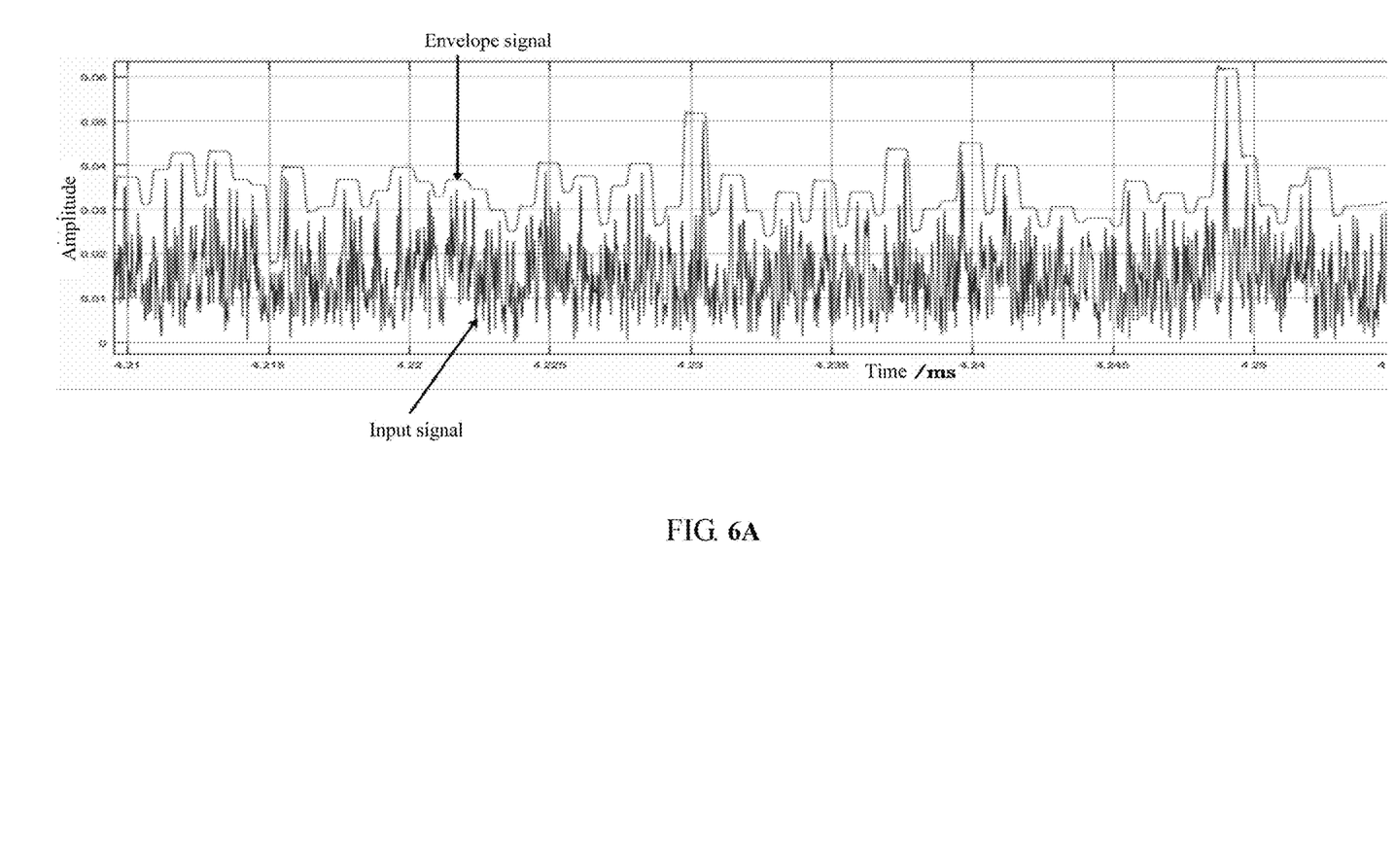
FIG. 6A shows simulation signal diagram when N is 20.
Figure 6B:
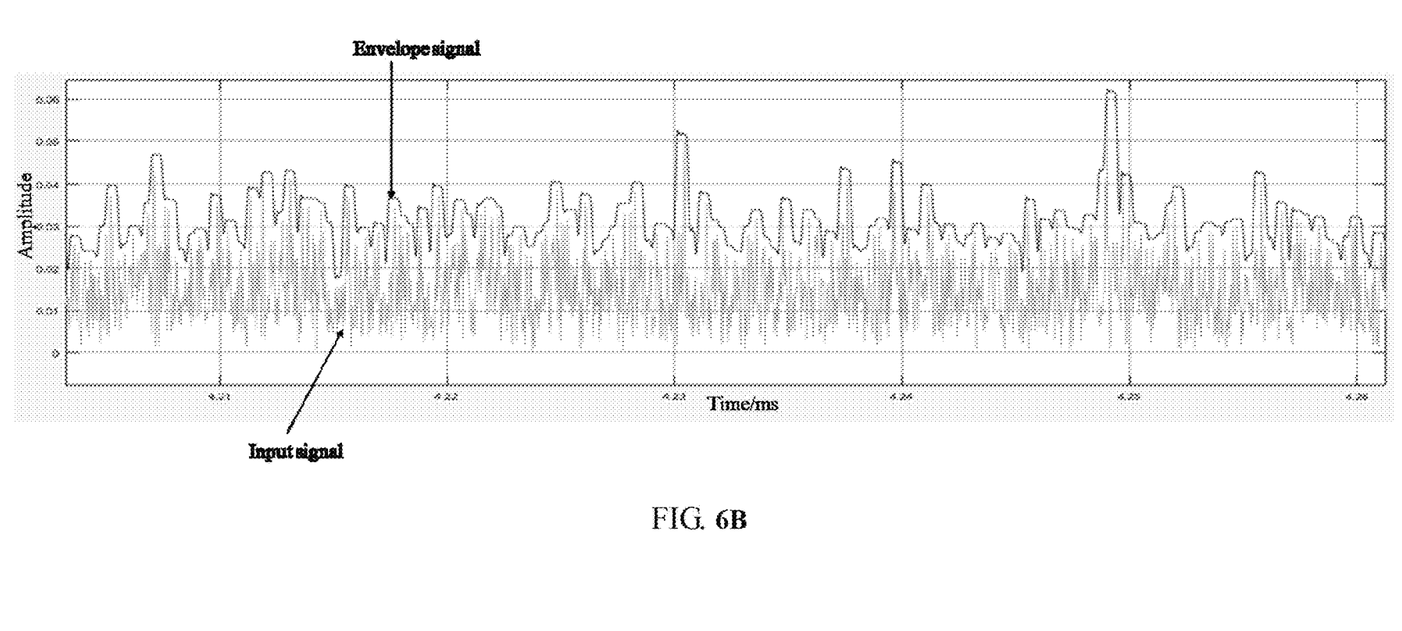
FIG. 6B shows simulation signal diagram when N is 10.

In at least one embodiment, the N can be 20 or 10. FIG. 6A shows results of simulating envelope signals when N=20, and FIG. 6B shows the simulation of envelope signals when N=10. The bandwidth of the envelope signals of FIG. 6A is broader than the bandwidth of the envelope signals of FIG. 6B. The broader bandwidth of the envelope signals is good for covering the peak amplitude of the input signals, and can reduce error prone of the system. However, not the broader the bandwidth of the envelope signals, the better for the system. The broader bandwidth of the envelope signals needs more energy, and this is not good for the system. Thus, not the bigger of the N, the better for the system. The number of the N is dependent on the system.

In the frequency domain, the envelope signals generated by the FSPT circuit 103 are effectively applied in the system. The spectrum width of the envelope signals which are generated by traditional envelope tracking technology is broader, and energy of effective spectrum is attenuated slowly. For example, the bandwidth of the envelope signals which are generated by traditional envelope tracking technology is 15 MHz, and the spectrum of the envelope signals can only be attenuated by 5 dB. However, the spectrum width of the envelope signals which are generated by the FSPT circuit 103 can decrease quickly, and thus the energy of effective spectrum can also be attenuated quickly. For example, the bandwidth of the envelope signals which are generated by the FSPT circuit 103 is 15 MHz, and the spectrum of the envelope signals can be attenuated by 100 dB. Thus, the spectrum of the envelope signals which are generated by the FSPT circuit 103 can be attenuated more than the envelope signals which are generated by the traditional envelope tracking technology.

Figure 7A:
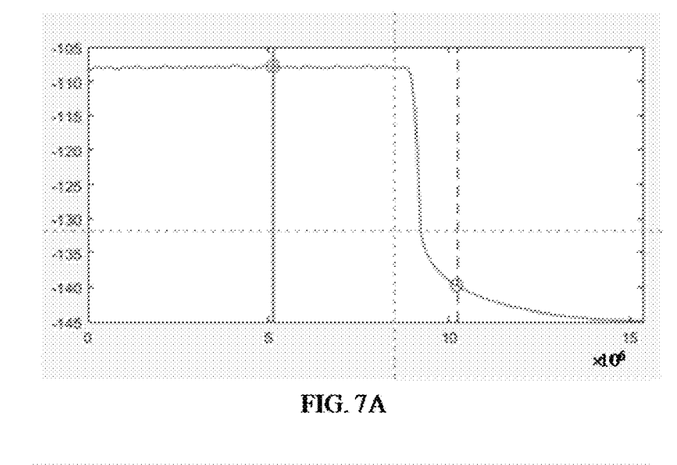
FIG. 7A illustrates spectrum of input signals which are not processed by the envelope tracking device of FIG. 1.
Figure 7B:
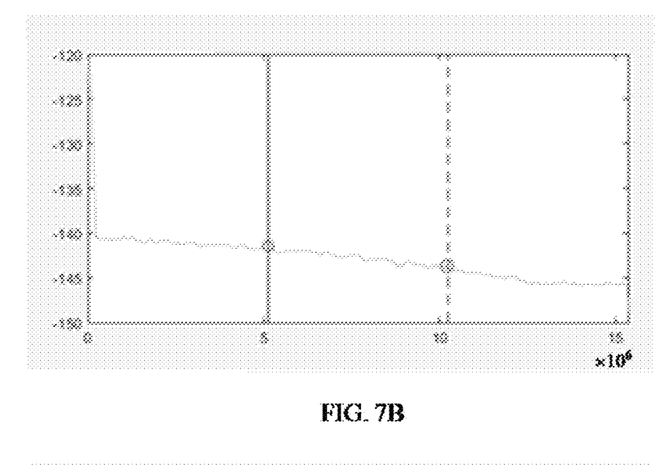
FIG. 7B illustrates spectrum of envelope signals generated by traditional envelope tracking technology.
Figure 7C:
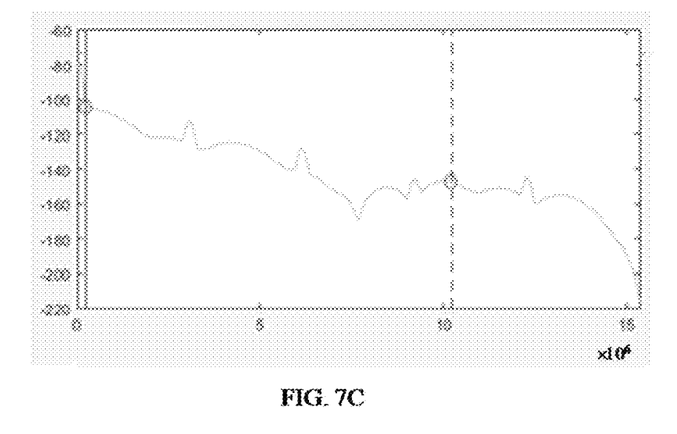
FIG. 7C illustrates spectrum of envelope signals generated by FSPT circuit and not filtered.
Figure 7D:
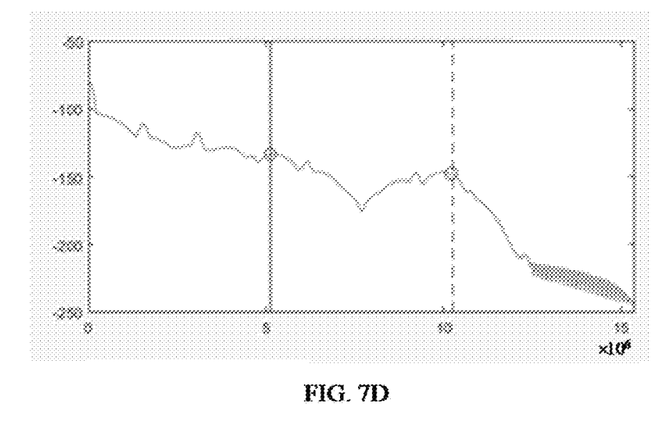
FIG. 7D illustrates spectrum of envelope signals generated by FSPT circuit and filtered.

FIGS. 7A-7D show the changes of spectrum width of the input signals when the input signals are processed by the FSPT circuit device. The bandwidth of the input signals is 20 MHz, and FIGS. 7A-7D show spectrum of half the bandwidth of the input signals. FIG. 7A shows the spectrum of the input signals not processed by the envelope tracking device. FIG. 7B shows the spectrum of the envelope signals generated by the traditional envelope tracking technology. The spectrum of the envelope signals in FIG. 7B is broad and can only be attenuated slowly. For example, the bandwidth of the envelope signals in FIG. 7B is 15 MHz, and the spectrum only can be attenuated by 5 dB. Thus, it is a high cost of the traditional envelope tracking technology for processing the input signals. For example, the bandwidth of baseband signals of the envelope modulator needs to be 2-3 times of the bandwidth of the input signals for attenuating the spectrum of the envelope signals quickly. FIG. 7C shows the spectrum of the envelope signals which is generated by the FSPT circuit 103 when the envelope signals are not filtered. The spectrum of the envelope signals in FIG. 7C is attenuated quickly. For example, the bandwidth of the envelope signals in FIG. 7C is 15 MHz, and the spectrum can be attenuated by 100 dB. FIG. 7D shows the spectrum of the envelope signals which is generated by the FSPT circuit 103 and the envelope signals are filtered. The spectrum of the envelope signals in FIG. 7D is attenuated quickly, and the bandwidth of the envelope signals in FIG. 7D is narrower than the bandwidth of the envelope signals in FIG. 7C. For example, the bandwidth of the envelope signals in FIG. 7C is 12 MHz, and the spectrum can be attenuated by 100 dB.

The input signal of the envelope tracking device 100 may become misaligned in time with the envelope signal which is generated by the envelope modulator 106. For example, the input signals may be delayed by delaying elements (e.g., filter or phase shifter) in the transmitting path. In existing technology, the time misalignment is regulated by the delay line 102. In the present disclosure, not only the delay line 102 can be used, but also the bandwidth of the envelope signals (i.e. values of K and L) can be adjusted, to control the transmission time of the envelope signals to the power ends of the amplifiers PA1, PA2, PA3 and PA4 and thus to resolve the problem of time misalignment.

Points S, R, E, $Pin_i$ (i=1, 2, 3, 4), and $Ps_j$ (j=1, 2, 3, 4) are introduced in FIG. 1 for illustrating transmission paths of the input signals. The point S represents the location to where the input signals were transferred after being processed by the CFR element 101. The point R represents the location to where the input signals were transferred after passing through the delay line 102 and being processed by the DAC 104a, the low-pass filter (LPF) 105 and the TX up converter 107a. The point E represents the location to where the input signals were transferred after being processed by the FSPT circuit 103, the DAC 104b, the EM 106. The point $Pin_i$ (i=1, 2, 3, 4) represent the locations of the gates of the power amplifiers PA1, PA2, PA3 and PA4. The point $Ps_j$ (j=1, 2, 3, 4) represent the location of the drains of the power amplifiers PA1, PA2, PA3, and PA4.

Figure 8:
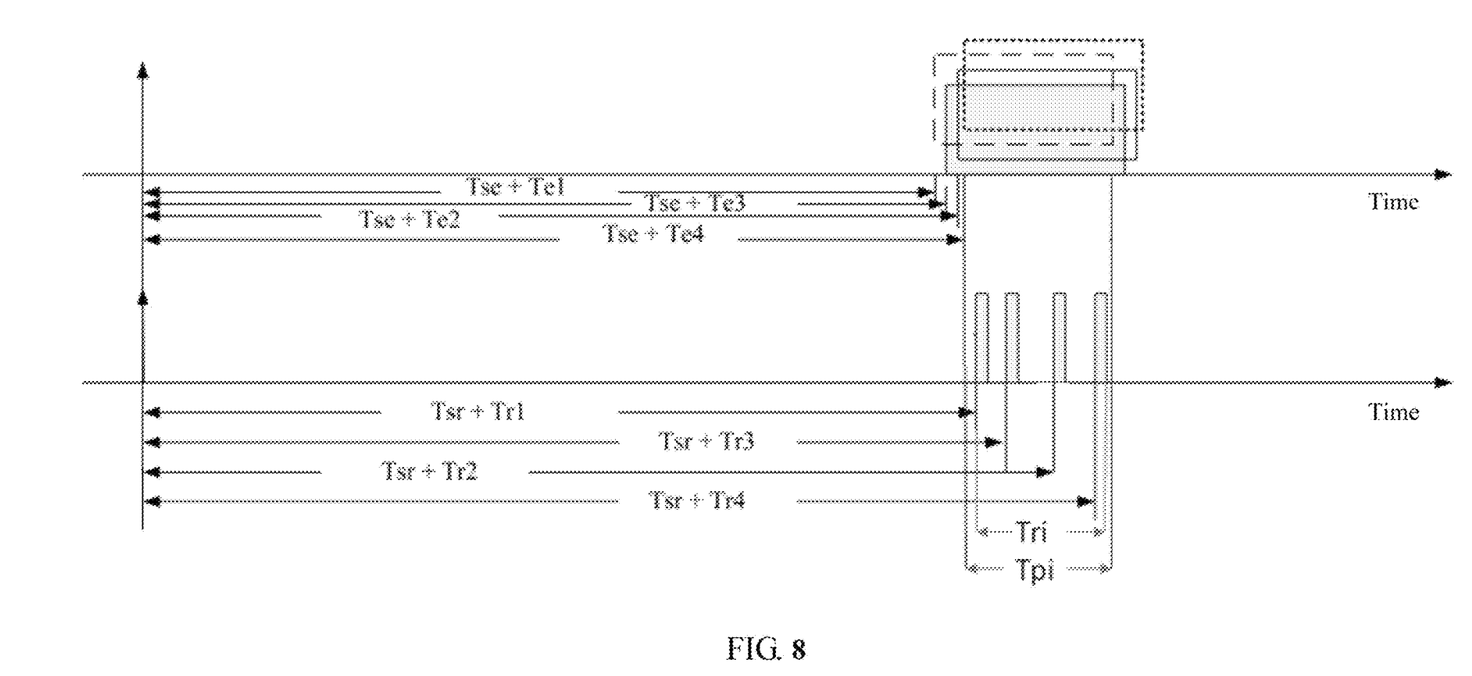
FIG. 8 shows a diagram of the time required for the input signals to be transmitted to the power amplifiers.

When the input signals are to be transmitted to the power amplifiers PA1, PA2, PA3, and PA4, the CFR element 101 can output the input signals to point S, and the input signals from the point S can be transmitted to the FSPT circuit 103. The FSPT circuit 103 can convert the input signals to envelope signals. The envelope signals from the FSPT circuit 103 are output to the DAC 104b. The DAC 104b can convert the envelope signals to analog envelope signals, and output the analog envelope signals to the envelope modulator 106. The envelope modulator 106 can process the analog envelope signals and output the analog envelope signals to the point E. At the point E, the analog envelope signals are distributed to four points Ps1, Ps2, Ps3, and Ps4 of four power amplifiers PA1, PA2, PA3, and PA4. As shown in FIG. 8, the time of transmission from the point S to the point Ps1 is Tse+Te1. The time of transmission from the point S to the point Ps2 is Tse+Te2. The time of transmission from the point S to the point Ps3 is Tse+Te3. The time of transmission from the point S to the point Ps4 is Tse+Te4. Tse is the time when the input signals are transmitted from the point S to the point E. Te1 is the time when the envelope signals are transmitted from the point E to the point Ps1. Te2 is the time when the envelope signals are transmitted from the point E to the point Ps2. Te3 is the time when the envelope signals are transmitted from the point E to the point Ps3, and Te4 is the time when the envelope signals are transmitted from the point E to the point Ps4. The values of Tse+Te1, Tse+Te2, Tse+Te3, and Tse+Te4 are almost the same.

The input signals are processed by the CFR element 101 and then transmitted to point S; and the input signals from the point S can be transmitted to the delay line 102. The input signals from the delay line 102 are output to the DAC 104b. The DAC 104b can convert the input signals to analog signals, and output the analog signals to the LPF 105. The LPF 105 can output the analog signals to the TX up converter 107a, and the TX up converter 107a can transfer the analog signals to point R. The power divider 108 can divide the analog signals at the point R into four parts, and transfer the four parts to the input points Pin1, Pin2, Pin3, and Pin4 of the power amplifiers PA1, PA2, PA3, and PA4. As shown in FIG. 8, the time of transmission from the point S to the point Pin1 of the power amplifier PA1 is Tsr+Tr1. The time of transmission from the point S to the point Pin2 of the power amplifier PA2 is Tsr+Tr2. The time of transmission from the point S to the point Pin3 of the power amplifier PA3 is Tsr+Tr3. The time of transmission from the point S to the point Pin4 of the power amplifier PA4 is Tsr+Tr4. Tsr is the time when the input signals are transmitted from the point S to the point R. Tr1 is the time when the input signals are transmitted from the point R to the point Pin1. Tr2 is the time when the input signals are transmitted from the point R to the point Pin2. Tr3 is the time when the input signals are transmitted from the point R to the point Pin3, and Tr4 is the time when the input signals are transmitted from the point R to the point Pin4. The values of Tsr+Tr1, Tsr+Tr2, Tsr+Tr3, and Tsr+Tr4 are different.

In at least one embodiment, Tpi is the minimum time set for multiple envelope signals being transmitted to the drain of the power amplifier. Tri is the maximum time set for multiple envelope signals being transmitted to the gate of the power amplifier. Tpi being larger than Tri can make the bandwidth of the envelope signals cover the bandwidth of the input signals. The time for the envelope signals generated by the FSPT circuit 103 to be transmitted to the drain of the power amplifier can be adjusted by adjusting the values of K and L. That is, Tpi can be larger than Tri by adjusting the values of K and L.

Figure 9:
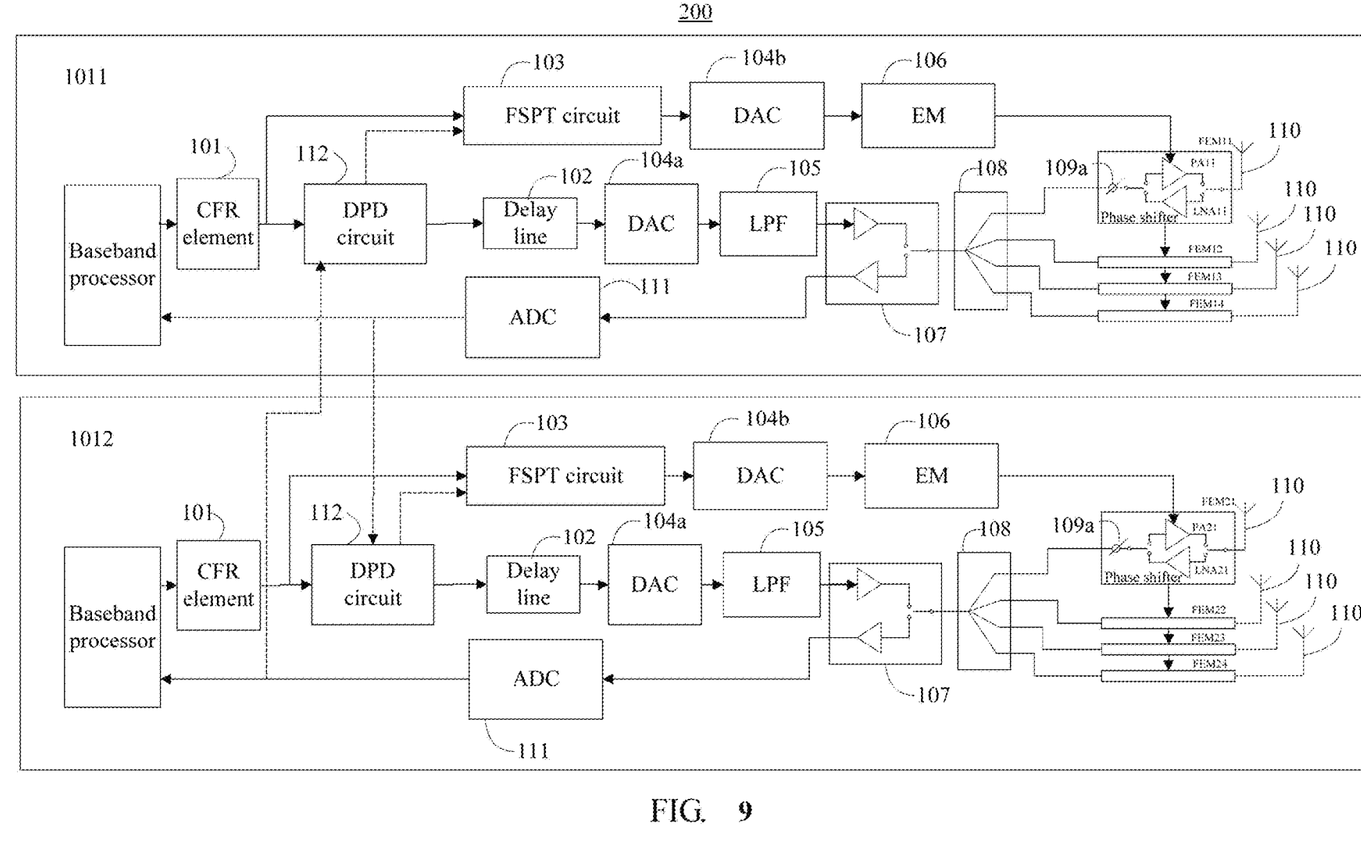
FIG. 9 is a block diagram of one embodiment of an envelope tracking system.

FIG. 9 is a block diagram of one embodiment of an envelope tracking system. In at least one embodiment, the envelope tracking system 200 can be utilized in a multiple input multiple output (MIMO) system. The envelope tracking system 200 can include a first envelope tracking device 1011, and a second envelope tracking device 1012. The first envelope tracking device 1011 and the second envelope tracking device 1012 can include, but are not limited to, the CFR element 101, the FSPT circuit 103, and the digital pre-distortion (DPD) circuit 112. The DPD circuit 112 can predict the non-linearity of the power amplifier, and use pre-distortion technology to process the input signals with the non-linear reverse of the amplifier. This can effectively linearize the power amplifier to transmit input signals. The DPD circuit 112 can correct AM-AM distortion and AM-PM distortion. The AM-AM distortion refers to amplitude distortion of the output signal and the input signal. For example, when voltage swing of the input signal is under the threshold voltage and above the saturation voltage, output voltage signal will be truncated or chopped. The AM-PM distortion refers to amplitude change of the input signal, caused by the nonlinear power amplifier, and nonlinear change of the phase difference between the output signals and the input signals, additionally caused by the nonlinear power amplifier, in accordance with the change of the input signals.

In existing technology, in order to reduce the AM-AM distortion and the AM-PM distortion, and improve the efficiency of the power amplifier, a feedback signal chain is needed. The feedback chain feeds back the output signal from the power amplifier to the DPD circuit 112. In present disclosure, the feedback signal of the DPD circuit 112 of the first envelope tracking device 1011 can be fed from the second envelope tracking device 1012 by coupling between the antenna 110 of the first envelope tracking device 1011 and the antenna 110 of the second envelope tracking device 1012. The feedback signal of the DPD circuit 112 of the second envelope tracking device 1012 can be fed from the first envelope tracking device 1011 by coupling between the antenna 110 of the first envelope tracking device 1011 and the antenna 110 of the second envelope tracking device 1012. The input signals which are outputted by the CFR element 101 or DPD circuit 112 can be coupled to the FSPT circuit 103.

For example, the signals outputted by the antenna 110 of the first envelope tracking device 1011 can be coupled to the antenna 110 of the second envelope tracking device 1012. When the antenna 110 of the second envelope tracking device 1012 receives the signals, the signals are transmitted through the receiving path of the second tracking device 1012 and then fed to the DPD circuit 112 of the first tracking device 1011 to generate a pre-distortion signal. The receiving path of the second tracking device 1012 can include a LAN 21, a phase shifter 109a, a power divider 108, a RX down converter 107b, and a ADC 111. The envelope tracking system 200 can thus generate a pre-distortion signal without additional feedback chain, and the pre-distortion signal can be coupled to the FSTP 103 of the first envelope tracking device 1011.

At the same time, the signals outputted by the antenna 110 of the second envelope tracking device 1012 can be coupled to the antenna 110 of the first envelope tracking device 1011. When the antenna 110 of the first envelope tracking device 1011 receives the signals, the signals are transmitted through the receiving path of the first tracking device 1011 and then fed to the DPD circuit 112 of the second tracking device 1012 to generate a pre-distortion signal. The receiving path of the first tracking device 1011 can include a LAN 11, a phase shifter 109a, a power divider 108, a RX down converter 107b, and a ADC 111. The pre-distortion signal can be coupled to the FSTP 103 of the second envelope tracking device 1012.

Figure 10:
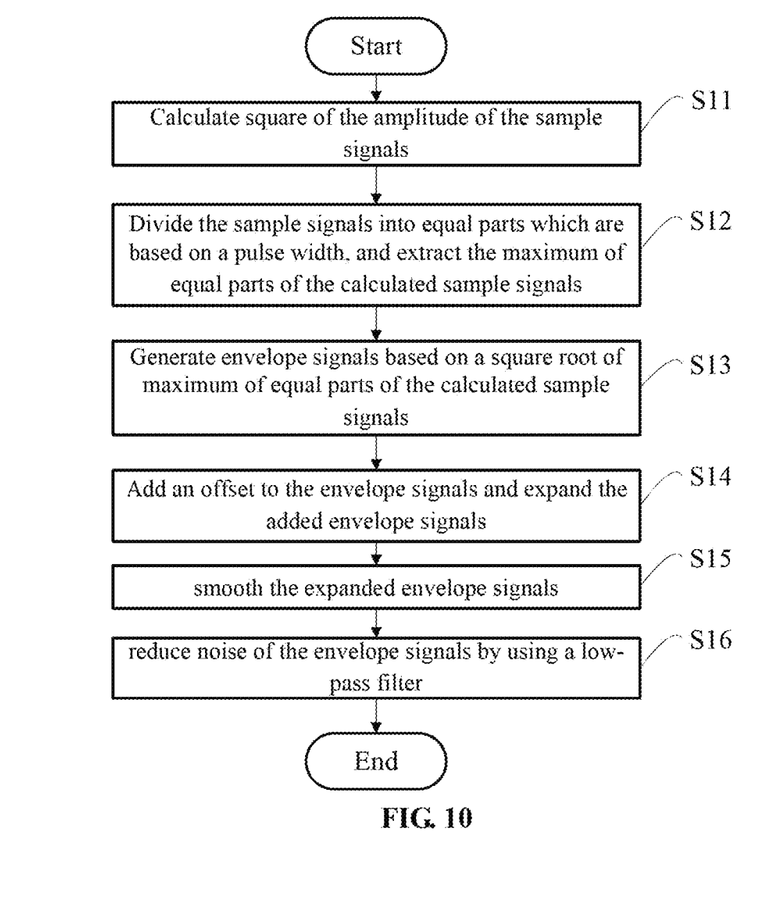
FIG. 10 illustrates a flowchart of one embodiment of an envelope tracking method using the envelope tracking device of FIG. 1.

FIG. 10 illustrates a flowchart of a method which is presented in accordance with an example embodiment. The exemplary method 1000 is provided by way of example, as there are a variety of ways to carry out the method. The method 1000 described below can be carried out using the configurations illustrated in FIG. 2, for example, and various elements of these figures are referenced in explaining exemplary method 1000. Each block shown in FIG. 10 represents one or more processes, methods, or subroutines, carried out in the exemplary method 1000. Additionally, the illustrated order of blocks is by example only and the order of the blocks can be changed according to the present disclosure. The exemplary method 1000 can begin at block S11. Depending on the embodiment, additional steps can be added, others removed, and the ordering of the steps can be changed.

At block S11, the calculating module 1030 can calculate the square of the amplitude of the sample signals, $D_i$=Sum_of_Square(t), Sum_of_Square(t)=$I^2(t)+Q^2(t)$. I(t) represents the in-phase signal of the input signal, and Q(t) represents the orthogonal signal of the input signal. For example, the FSPT circuit 103 can sample the input signals with bandwidth of 20 MHz, the sampling frequency is 30.72 MHz, and there are 1000 samples.

At block S12, the extracting module 1031 can divide the sample signals into equal parts based on a pulse width, and extract the maximum number of equal parts of the calculated sample signals. For example, the extracting module 1031 can divide 1000 sample signals into 500 equal parts, each part of the divided signal being D1, D2 . . . DN, and N=20. The maximum number of equal parts of the calculated sample signals is $D_m$=max_of[$D_1, D_2 \ldots D_N$]. Thus, the pulse width is equal to a sum of the width of 20 consecutive sample signals of the 1000 sample signals.

At block S13, the extracting module 1031 can generate envelope signals based on a square root of maximum of equal parts of the calculated sample signals, Sqrt($D_m$)= $\sqrt{\text{Max\_of}[D_1, D_2 \ldots D_N]}$. The envelope signals are shown in FIG. 4. The amplitude of each pulse of the envelope signals is equal to the square root of maximum of equal parts of the calculated sample signals, and the width of each pulse of the envelope signals is the same.

At block S14, the extension module 1031 can add an offset to the envelope signals, Peak$_j$=Sqrt($D_m$)+offset, and expand the added envelope signals. The added envelope signals can cover the peak amplitude of the input signals.

In at least one embodiment, the expanding module 1032 can include a first register and a second register storing respectively two neighboring envelope signals. The peak amplitude of first envelope signal is Peak$_j$, and the first envelope signal is stored in the first register. The peak amplitude of second envelope signal is Peak$_{j-1}$, and the second envelope signal is stored in the second register. Each of the two neighboring envelope signals includes N samples, and the pulse widths of the two neighboring envelope signals are the same. The first register can be compared with the second register to determine which peak amplitude of the two neighboring envelope signals is greater. When Peak$_j$ is greater than Peak$_{j-1}$, the expanding module 1032 can expand the first envelope signal with K samples. When Peak$_{j-1}$ is greater than Peak$_j$, the expanding module 1032 can expand the second envelope signal with L samples. The values of K and L are dependent on the system.

In at least one embodiment, the expanding module 1032 can expand the envelope signals to the right or left, or expand simultaneously in both directions. For example, the expanding module 1032 can expand the first envelope signal to the right or left with K samples, or expand the first envelope signals to the right and left with K samples at the same time.

In at least one embodiment, the N can be 20 or 10. FIG. 6A shows results of simulating envelope signals when N=20, and FIG. 6B shows the simulation of envelope signals when N=10. The bandwidth of the envelope signals of FIG. 6A is broader than the bandwidth of the envelope signals of FIG. 6B. The broader bandwidth of the envelope signals is good for covering the peak amplitude of the input signals, and can reduce error prone of the system. However, not the broader the bandwidth of the envelope signals, the better for the system. The broader bandwidth of the envelope signals needs more energy, and this is not good for the system. Thus, not the bigger of the N, the better for the system. The number of the N is dependent on the system.

At block S15, the smoothing module 1033 can smooth the expanded envelope signals. The smoothing module 1033 can reduce ringing effects of the expanded envelope signals by moving average technology.

At block S16, the filtering module 1034 can reduce noise of the envelope signals by using a low-pass filter.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An envelope tracking device comprises:
   a fine slot peak tracking circuit configured to:
      generate sample signals by sampling input signals coupled to the fine slot peak tracking circuit;
      calculate square of the amplitude of the sample signals;
      divide the sample signals into equal parts based on a pulse width, and extract the maximum number of equal parts of the calculated sample signals;
      generate envelope signals based on a square root of the maximum number of equal parts of the calculated sample signals;
      add an offset to the envelope signals;
      expand the added envelope signals; and
      smooth the expanded envelope signals;
   at least one power amplifier;
   an envelope modulator, and the fine slot peak tracking circuit is electrically connected to the at least one power amplifier through the envelope modulator;
   the envelope modulator configured to generate envelope voltage signals according to the smoothed envelope signals, and transmit the envelope voltage signals to a drain of the at least one power amplifier, and the envelope voltage signals are time-aligned with amplified signals transmitted to a gate of the at least one power amplifier.

2. The envelope tracking device according to claim 1, wherein the pulse width is equal to a sum of the width of N consecutive sample signals of M sample signals.

3. The envelope tracking device according to claim 1, wherein the step "expand the added envelope signals" comprises:
   store a first envelope signal into a first register, and the peak amplitude of the first envelope signal is $Peak_j$, wherein the first envelope signal comprises N sample signals;
   store a second envelope signal into a second register, and the peak amplitude of the second envelope signal is $Peak_{j-1}$, wherein the second envelope signal comprises N sample signals, and the second envelope signal and the first envelope signal are neighboring;
   when $Peak_j$ is greater than $Peak_{j-1}$, the fine slot peak tracking circuit expands the first envelope signal with K sample signals; and
   when $Peak_{j-1}$ is greater than $Peak_j$, the fine slot peak tracking circuit expands the second envelope signal with L sample signals.

4. The envelope tracking device according to claim 3, further comprises a low-pass filter which is configured to filter the smoothed envelope signals.

5. The envelope tracking device according to claim 1, further comprises a delay line which is configured to make the envelope voltage signals aligned in time with the amplified signals transmitted to the gate of the at least one power amplifier.

6. The envelope tracking device according to claim 5, further comprises a crest factor reduction element, and the input signals processed by the crest factor reduction element are outputted to the delay line and the fine slot peak tracking circuit.

7. The envelope tracking device according to claim 3, wherein making a minimum time set for multiple envelope signals being transmitted to the drain of the at least one power amplifier larger than a maximum time set for multiple envelope signals being transmitted to the gate of the at least one power amplifier by adjusting values of K and L.

8. An envelope tracking system comprises:
   a first envelope tracking device and a second envelope tracking device, wherein the first envelope tracking device and the second envelope tracking device comprise a fine slot peak tracking circuit, an envelope modulate, and at least one power amplifier;
   the fine slot peak tracking circuit configured to:
      generate sample signals by sampling input signals coupled to the fine slot peak tracking circuit;
      calculate square of the amplitude of the sample signals;
      divide the sample signals into equal parts based on a pulse width, and extract the maximum number of equal parts of the calculated sample signals;
      generate envelope signals based on a square root of the maximum number of equal parts of the calculated sample signals;
      add an offset to the envelope signals;
      expand the added envelope signals; and
      smooth the expanded envelope signals;
   the fine slot peak tracking circuit is electrically connected to the at least one power amplifier through the envelope modulator;
   the envelope modulator configured to generate envelope voltage signals according to the smoothed envelope signals, and transmit the envelope voltage signals to a drain of the at least one power amplifier, and the envelope voltage signals are time-aligned with amplified signals transmitted to a gate of the at least one power amplifier;
   couple signals transmit by antenna of the first envelope tracking device to antenna of the second envelope tracking device, and the second envelope tracking device generates pre-distortion signals by feeding back the signals to a digital pre-distortion circuit of the first envelope tracking device; and
   couple signals transmit by the antenna of the second envelope tracking device to the antenna of the first envelope tracking device, and the first envelope tracking device generates pre-distortion signals by feeding back the signals to a digital pre-distortion circuit of the second envelope tracking device.

9. The envelope tracking system according to claim 8, wherein the pulse width is equal to a sum of the width of N consecutive sample signals of M sample signals.

10. The envelope tracking system according to claim 8, wherein the step "expand the added envelope signals" comprises:

store a first envelope signal into a first register, and the peak amplitude of the first envelope signal is $Peak_j$, wherein the first envelope signal comprises N sample signals;

store a second envelope signal into a second register, and the peak amplitude of the second envelope signal is $Peak_{j-1}$, wherein the second envelope signal comprises N sample signals, and the second envelope signal and the first envelope signal are neighboring;

when $Peak_j$ is greater than $Peak_{j-1}$, the fine slot peak tracking circuit expands the first envelope signal with K sample signals; and when $Peak_{j-1}$ is greater than $Peak_j$, the fine slot peak tracking circuit expands the second envelope signal with L sample signals.

11. The envelope tracking system according to claim 8, the fine slot peak tracking circuit further comprises a low-pass filter which is configured to filter the smoothed envelope signals.

12. The envelope tracking system according to claim 8, wherein the first envelope tracking device and the second envelope tracking device further comprises a delay line which is configured to make the envelope voltage signals aligned in time with the amplified signals that are transmitted to the gate of the at least one power amplifier.

13. The envelope tracking system according to claim 12, wherein the first envelope tracking device and the second envelope tracking device further comprises a crest factor reduction element.

14. The envelope tracking system according to claim 13, wherein the crest factor reduction element is electrically connected with the delay line through the digital pre-distortion circuit.

15. The envelope tracking system according to claim 14, wherein one or more input signals outputted by the crest factor reduction element or the digital pre-distortion circuit are coupled to the fine slot peak tracking circuit.

16. An envelope tracking method applied in an envelope tracking device, the envelope tracking device comprises a fine slot peak tracking circuit, at least one power amplifier, and an envelope modulator, the method comprises:

generating sample signals by sampling input signals coupled to the fine slot peak tracking circuit;

calculating square of the amplitude of the sample signals;

dividing the sample signals into equal parts which are based on a pulse width, and extracting the maximum of equal parts of the calculated sample signals;

generating envelope signals based on a square root of the maximum of equal parts of the calculated sample signals.

17. The envelope tracking method according to claim 16, further comprises:

adding an offset to the envelope signals;

expanding the added envelope signals; and smoothing the expanded envelope signals.

18. The envelope tracking method according to claim 16, wherein the pulse width is equal to a sum of the width of N consecutive sample signals of M sample signals.

19. The envelope tracking method according to claim 16, wherein the step "expanding the added envelope signals" comprises:

storing a first envelope signal into a first register, and the peak amplitude of the first envelope signal is $Peak_j$, wherein the first envelope signal comprises N sample signals;

storing a second envelope signal into a second register, and the peak amplitude of the second envelope signal is $Peak_{j-1}$, wherein the second envelope signal comprises N sample signals, and the second envelope signal and the first envelope signal are neighboring;

when $Peak_j$ is greater than $Peak_{j-1}$, the fine slot peak tracking circuit expanding the first envelope signal with K sample signals; and when $Peak_j$ is greater than $Peak_j$, the fine slot peak tracking circuit expanding the second envelope signal with L sample signals.

* * * * *